US010396469B1

(12) United States Patent
Fritz et al.

(10) Patent No.: US 10,396,469 B1
(45) Date of Patent: Aug. 27, 2019

(54) METHOD FOR MANUFACTURING THREE-DIMENSIONAL ELECTRONIC CIRCUIT

(71) Applicant: The Charles Stark Draper Laboratory, Inc., Cambridge, MA (US)

(72) Inventors: Gregory M. Fritz, Acton, MA (US); Kenneth P. Vandevoordt, North Reading, MA (US); Rebecca A. DeFronzo, Salem, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 415 days.

(21) Appl. No.: 15/179,047

(22) Filed: Jun. 10, 2016

Related U.S. Application Data

(60) Provisional application No. 62/196,664, filed on Jul. 24, 2015.

(51) Int. Cl.
*H01Q 21/00* (2006.01)
*H01Q 9/04* (2006.01)
(Continued)

(52) U.S. Cl.
CPC ....... *H01Q 21/0087* (2013.01); *H01Q 9/0407* (2013.01); *H05K 3/108* (2013.01);
(Continued)

(58) Field of Classification Search
CPC ........ H05K 3/108; H05K 3/12; H05K 3/1216; H05K 3/1258; H05K 3/184; H10Q 9/0407;
(Continued)

(56) References Cited

U.S. PATENT DOCUMENTS 6,099,702 A    8/2000   Reid et al. .................... 204/212
6,725,528 B1 *   4/2004   Nishi ............... Y10T 29/49155
                                         29/602.1
(Continued)

FOREIGN PATENT DOCUMENTS

JP       11040937 A   *   2/1999

OTHER PUBLICATIONS

Sanz-Izquierdo et al., *3-D Printing of Elements in Frequency Selective Arrays*, IEEE Transactions on Antennas and Propagation, vol. 62, No. 12, pp. 6060-6066, Dec. 2014.
(Continued)

*Primary Examiner* — A. Dexter Tugbang
(74) *Attorney, Agent, or Firm* — Sunstein Kann Murphy & Timbers LLP

(57) ABSTRACT

An electronic circuit is made by selectively depositing an electrically conductive material seed layer conformally upon a three-dimensional substrate via the plurality of apertures of a three-dimensional mask. The substrate is then plated with more of the same electrically conductive material, or a different electrically conductive material, on the seed layer. In the case of electroplating, a nonconductive support structure is incorporated into a conductive clamp for making electrical connection to the seed layer. An environmentally protective layer may be deposited upon the electrically conductive material to such an extent that the electronic circuit remains solderable. The three-dimensional mask may be fabricated by an additive manufacturing technique.

40 Claims, 7 Drawing Sheets

(51) Int. Cl.
*H05K 3/18* (2006.01)
*H05K 3/12* (2006.01)
*H05K 3/10* (2006.01)

(52) U.S. Cl.
CPC ............. *H05K 3/12* (2013.01); *H05K 3/1216* (2013.01); *H05K 3/1258* (2013.01); *H05K 3/184* (2013.01); *Y10T 29/49016* (2015.01); *Y10T 29/49124* (2015.01); *Y10T 29/49155* (2015.01); *Y10T 29/49222* (2015.01)

(58) Field of Classification Search
CPC .......... H01Q 21/0087; Y10T 29/49016; Y10T 29/49124; Y10T 29/49155; Y10T 29/49222

See application file for complete search history.

(56) References Cited

U.S. PATENT DOCUMENTS

| | | | | |
|---|---|---|---|---|
| 7,951,724 | B2 | 5/2011 | Fyten et al. | ............... 438/745 |
| 2005/0245059 | A1* | 11/2005 | Yuan | ............... H05K 3/108 438/612 |
| 2007/0074899 | A1* | 4/2007 | Aonuma | ............... H05K 3/108 174/260 |
| 2008/0052904 | A1* | 3/2008 | Schneider | ............ H05K 3/1258 29/846 |
| 2009/0211786 | A1* | 8/2009 | Bamba | ................... H05K 3/108 174/250 |

OTHER PUBLICATIONS

Adams et al., *Conformal Printing of Electrically Small Antennas on Three-Dimensional Surfaces*, Advanced Materials, vol. 23, Issue 11, pp. 1335-1340, Wiley-VCH Verlag GmbH & Co KGaA, Weinheim, Mar. 2011.

Best, *The Radiation Properties of Electrically Small Folded Spherical Helix Antennas*, IEEE Transactions on Antennas and Propagation, IEEE, vol. 52, No. 4, pp. 953-960, Apr. 2004.

Ehrenberg et al., *Fully Conformal FSS via Rapid 3D Prototyping*, proceedings of the 2012 IEEE International Symposium on Antennas and Propagation, 2 pages, Jul. 8-14, 2012.

Ehrenberg et al., *Advancement of 3D Printed Conformal FSS and Active Array*, 2014 USNC-URSI Radio Science Meeting (Joint with AP-S Symposium), IEEE, p. 275, Jul. 6-11, 2014.

Nassar et al., *A 3-D Printed Miniaturized Log-Periodic Dipole Antenna*, 2014 IEEE Antennas and Propagation Society International Symposium (APSURSI), IEEE, pp. 11-12, Jul. 6-11, 2014.

Unknown, *Metal Plating Processes and Methods of Measuring Surface Hardness and Thickness of Coatings*, Technical Report TR-#105, Bal Seal Engineering Co, Inc., 15 pages, Oct. 27, 2003.

Unknown, *Copper Plating (Electroplating) Services per MIL-C-14550 and ASTM B734*, https://web.archive.org/web/20140816174822/http://advancedplatingtech.com/copper-plating-services//, Advanced Plating Technologies, 4 pages, Aug. 16, 2014.

Unknown, *Objet Connex 3D Printers*, https://web.archive.org/web/20150625112457/http://www.stratasys.com/3d-printers/design-series/connex-systems, Stratasys Ltd., 3 pages, Jun. 25, 2015.

\* cited by examiner

METHOD FOR MANUFACTURING THREE-DIMENSIONAL ELECTRONIC CIRCUIT

The present application claims priority from U.S. provisional application Ser. No. 62/196,664, filed Jul. 24, 2015, the full disclosure of which is hereby incorporated by reference herein.

TECHNICAL FIELD

The present invention relates to electronic circuit manufacturing and, more particularly, to the use of masks to selectively deposit conductive metals onto three-dimensional substrates.

BACKGROUND ART

Physical shadow masks are used in combination with thin film deposition techniques to pattern thin materials upon substrates. Very often, silicon is the substrate and the thin material is a metal, such as copper, or a dielectric, such as silicon dioxide. These patterns may serve optical functions (such as modifying the appearance of a substrate), electronic functions (such as modifying the dielectric constant of a material or forming electronic circuits), magnetic functions, or other functionality. Typically, the substrate is planar such as with silicon wafers and the physical shadow mask is also planar to match. The shadow mask is a single material which has apertures cut out of it to form a pattern. This pattern is the negative of the pattern which will be transferred to the substrate. It is important to have intimate contact between the shadow mask and the substrate so that the deposited material only deposits under the apertures in the mask and not under the solid portions of the mask. The materials may be conductors, such as metals, and the deposition may be by chemical vapor deposition (CVD) or by physical vapor deposition (PVD), such as sputtering or evaporative deposition.

Antenna designs such as the one disclosed in U.S. Pat. No. 8,922,452 offer superior properties to planar electrical circuits but cannot be economically manufactured on a commercial scale using existing methods. Several firms attempted the fabrication of this design without success.

In the prior art, physical shadow masks are fabricated using subtractive machining, such as milling or reactive ion etching. Such a mask is then attached to a substrate prior to metal deposition. Alternately, masks have been additively printed and then, prior to metal deposition, bridges have been added to make the masked features continuous, as taught by Isaac M. Ehrenberg, et al.

Isaac M. Ehrenberg, et al., used an additive manufacturing process that included a 3D printer to fabricate a paraboloid and a conformal mask on the surface of the paraboloid. Electron beam evaporation was then used to deposit copper, through apertures in the mask, onto the surface of the paraboloid. However, Ehrenberg's process deposits a film about 1.2 µm thick, which is relatively thick for an evaporative process, but is too thin for soldering. Furthermore, Ehrenberg's films are thinner than the skin depth of ultra-high frequency (UHF) signals, such as signals used in global positioning systems (GPS) receivers. The skin depth of such a signal in copper is about 2-5 µm, with a resistivity between about 1.68 and about 16.8 µOhm-cm. Ehrenberg's thin layer of deposited metal and, its high electrical resistance, therefore, does not satisfy many applications. Furthermore, the layer of deposited metal is too thin to be soldered.

Some electronic circuit fabrication techniques do not involve masks. For example, metallic inks have been omnidirectional printed directly on flexible, stretchable and curvilinear surfaces. However, with currently available technology, electrical resistivity of resulting circuits is several times larger than metallic bulk resistivity or thin film resistivity.

SUMMARY OF EMBODIMENTS

An embodiment of the present invention provides a method for fabricating a three-dimensional electronic circuit that can be soldered. A mask defines a plurality of apertures therethrough. The mask has an interior shape that conforms to at least a non-planar portion of an exterior shape of a three-dimensional substrate. The mask is used to selectively deposit an electrically conductive material on the substrate via the apertures. Doing so forms a seed layer of the electrically conductive material on the substrate. The method further requires removing at least a portion of the mask and plating an electrically conductive material on the seed layer. The plating material may or may not be the same as the electrically conductive material deposited on the substrate. Plating may be performed by electroplating or electroless plating. In particular embodiments, plating forms an electrically conductive film having a thickness of 4-100 µm, which allows the circuit to be electrically combined with other electronic components via soldering or other types of bonding.

The non-planar portion of the exterior shape of a three-dimensional substrate may define at least one concave shape. Alternatively, the non-planar portion of the exterior shape of a three-dimensional substrate may be even more complex defining at least one concave shape and at least one convex shape. In particular, the non-planar portion may be an undulating shape.

Fabricating the mask may or may not be performed by an additive technique. The additive technique may or may not be used to make the substrate. In an embodiment of the method, the mask is fabricated in situ, in intimate contact with the non-planar portion of the exterior shape of the three-dimensional substrate.

The electronic circuit, particularly an antenna, benefits from additionally depositing an environmentally protective coating over the electrically conductive material. The coating should be penetrable by soldering so as to allow soldering to the electrically conductive material. In particular, the coating may be deposited by RF sputtering of silicon nitride to a depth between 10 nm and 3000 nm.

Electroplating includes electrically contacting against the metal trace for applying a voltage. In accordance with an embodiment of the invention, the contacting component is adaptable to the three-dimensional nature of the substrate. Electroplating is most consistent and reliable with a secure, low resistance ohmic contact to the conductive trace. To that end, embodiments include a nonconductive support structure arranged to permit tightening of a conductive clamp against the trace. An embodiment may include a nonconductive threaded shaft arranged so that rotation of the shaft tightens or loosens the low resistance contact against the trace. In particular, electroplating may use two electrical contacts for applying voltage to both ends of the trace.

BRIEF DESCRIPTION OF THE SEVERAL VIEWS OF THE DRAWING

The invention will be more fully understood by referring to the following Detailed Description of Specific Embodiments in conjunction with the Drawings, of which.

DETAILED DESCRIPTION OF SPECIFIC EMBODIMENTS

Figure 1:
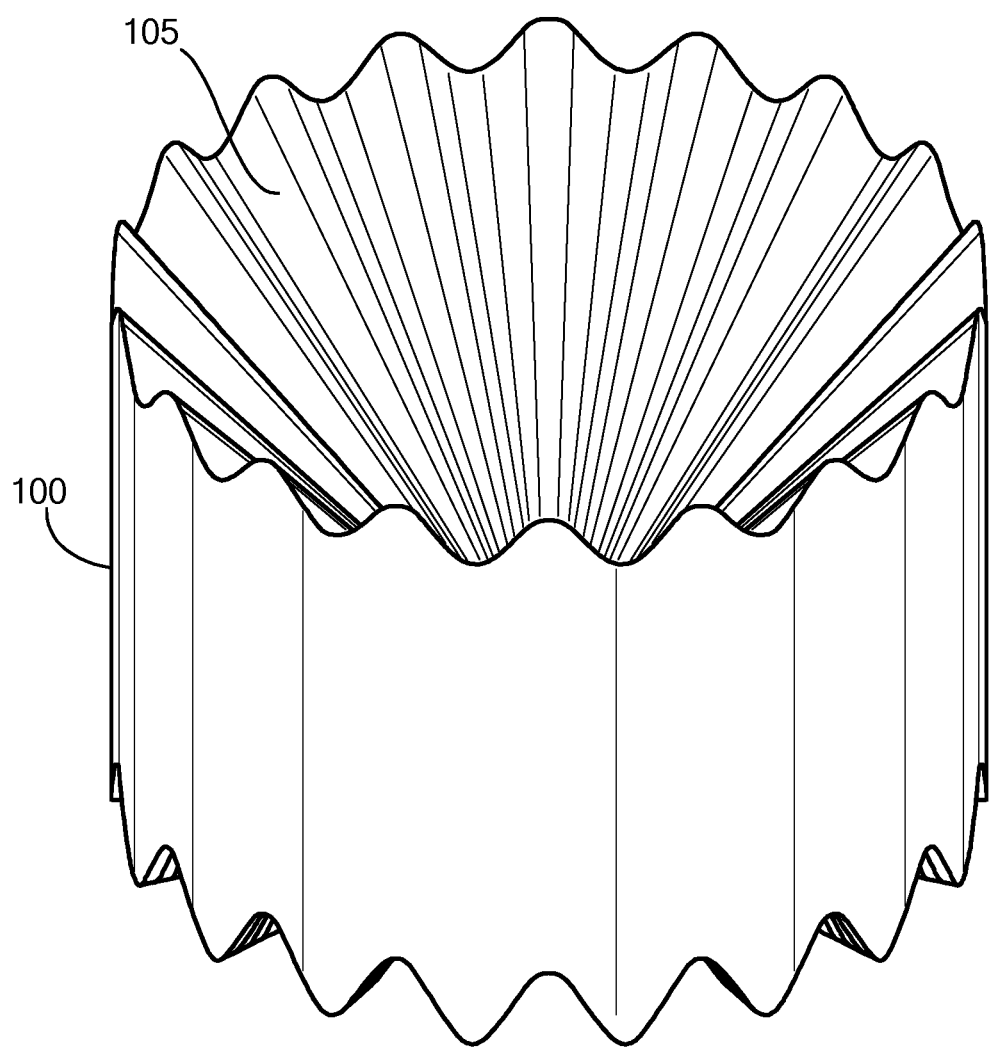
FIG. 1 is a perspective illustration of a hypothetical exemplary substrate, according to the prior art.

Methods and apparatus are disclosed for fabricating three-dimensional masks for use in making electronic circuits. In some embodiments, the masks are conformally fabricated directly on three-dimensional substrates. In other embodiments, stand-alone masks are fabricated, i.e., the masks are not conformally fabricated on the substrates. Instead, after the masks are fabricated, the masks may be conformally attached to the three-dimensional substrates. In either case, the masks are used to pattern a seed material, which may be a metal or a nonmetal, for the purposes of forming electronic circuits. The masks may then be removed, such as by chemical removal or mechanical removal. In accordance with embodiments of the present invention, additional material is then deposited on the seed material, such as by electroplating or electroless plating.

The three-dimensional substrates may have positive, i.e., convex, surface features, negative, i.e., concave, surface features or both positive and negative surface features. In particular embodiments, a non-planar portion of the three-dimensional substrate has convex and concave features arranged to form an undulating surface. The substrates may be materials, such as silicon, silicon germanium, or gallium arsenide, conventionally used for electronic circuits. The substrates may be polymeric materials, such as Polyetherimide, nylon, or polyimide, which are not conventionally used for electronic circuits.

As noted, in the prior art, electrical conductors have been printed using conductive inks in 3D printing processes. However, resulting circuits have electrical resistivity many times higher than bulk or thin films of the same material due primarily to electron scattering at particle/particle interfaces. Furthermore, the number of electrically conductive inks developed thus far, and therefore the range of choices of metal/dielectric combinations usable with these inks, is far less than is available using PVD or CVD deposition.

Thin electrically conductive layers have been deposited through 3D-printed shadow masks. However, metallic layers deposited through 3D-printed shadow masks are too thin to be soldered to without the metal layers lifting off the substrate or melting.

Electrical circuits, such as most antennas, require electrically conductive connections to be made by solder, such as to electrically connect a radiating surface to a balun or feed line or other electronic components.

The out-of-plane electronic circuits fabricated according to embodiments of the present invention are solderable and exhibit electrical conductivity as good as planar thin films. Electronic circuits fabricated according to embodiments of the present invention may be capable of carrying electric currents at least as great as conventional 3D-printed circuits or circuits fabricated by conventional thin film deposition, when equal amounts of material are deposited according to the present invention and according to the prior art and conventionally-made circuits. Circuits fabricated according to embodiments of the present invention may have conformal electrically conductive films, such as copper, that are at least twice as thick as the skin depth of GPS signals, which are on the order of about 4-10 μm deep.

The masks described herein may be fabricated using commercially available additive manufacturing methods, such as polyjet printing, stereolithography, fused deposition modeling, selective laser sintering, selective laser melting, or electron beam melting. For example, a jet printer such as an Objet260 Connex 3D printer, available from Stratasys Ltd., Minneapolis, Minn., or a stereolithography printer such as a Viper model 3D printer from 3D Systems, Rock Hill, S.C., may be used to fabricate the masks. The masks may be fabricated according to computer-aided design (CAD) three-dimensional models that are conventionally developed. The masks may be fabricated of materials conventionally used in additive manufacturing.

FIG. 1 is a perspective illustration of a hypothetical exemplary substrate 100, on which an electrically conductive circuit should be fabricated. The substrate 100 may be conventionally fabricated, such as by a semiconductor fabrication process, a subtractive manufacturing process, an additive manufacturing process (such as 3D printing) or any other suitable fabrication process. The hypothetical exemplary substrate 100 defines three-dimensional surface features, exemplified by features at 105. In this example, as shown, convex and concave features form an undulating non-planar surface.

In some embodiments, additive manufacturing is used to fabricate the substrate and then to fabricate the mask on the substrate. A single 3D printer may be used to fabricate the substrate and the mask in a single fabrication process. In some embodiments, the substrate and the mask are fabricated of the same material. In some embodiments, the substrate is fabricated of a different material than the mask.

In some embodiments, the mask is fabricated separate from the substrate. The substrate can, but need not, be fabricated using additive manufacturing methods. For example, the substrate can be fabricated using conventional semiconductor wafer fabrication techniques and then the mask attached mechanically or with an adhesive. A substrate, however fabricated, may be placed in an additive manufacturing machine, and a mask may be fabricated directly upon the three-dimensional surface of the substrate.

The mask material may be different than the substrate material. For example, the substrate may be fabricated of a material that cannot be used in an additive manufacturing process.

Figure 2:
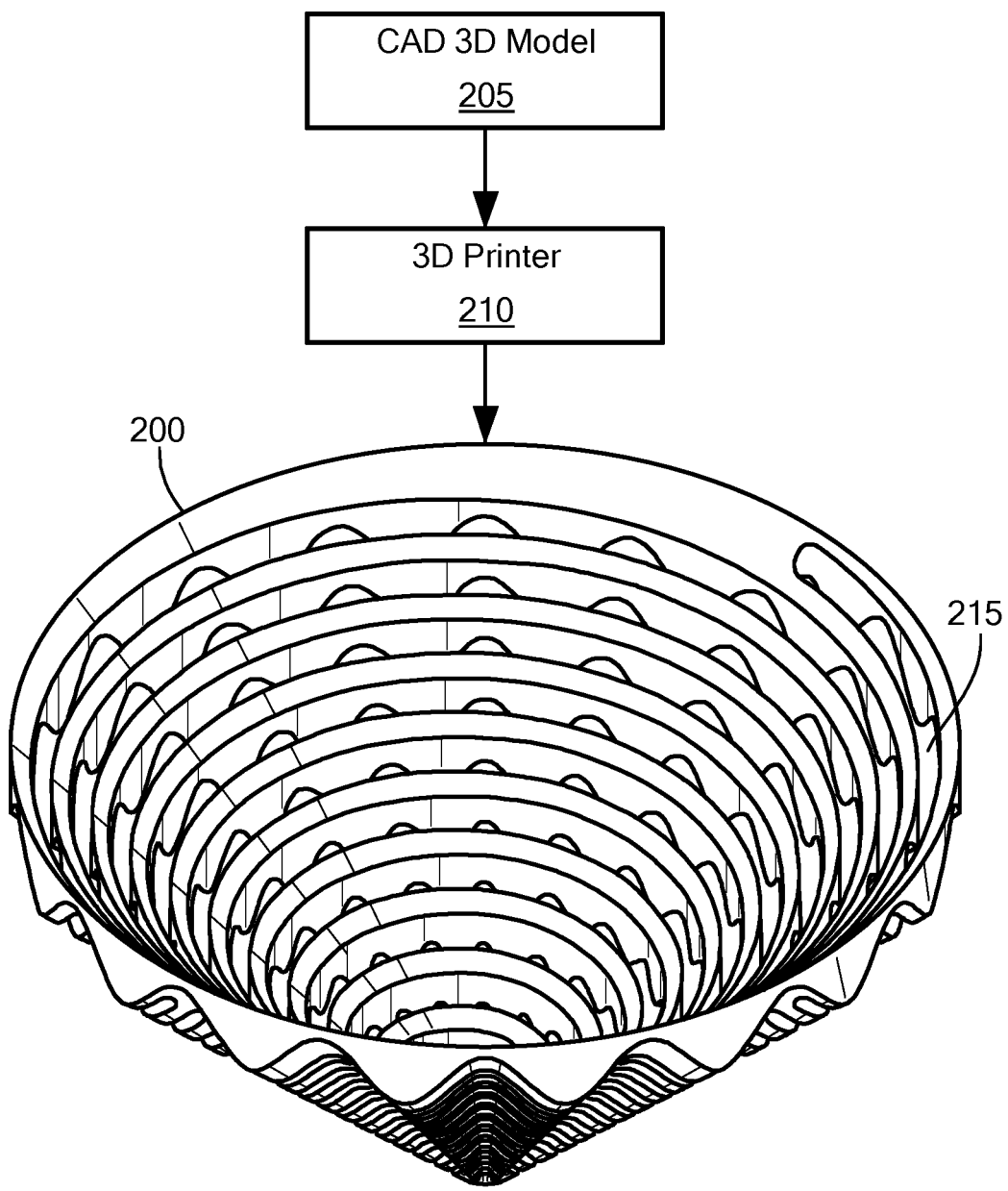
FIG. 2 is a schematic block diagram illustrating a process of fabricating a shadow mask, according to an embodiment of the present invention.

As noted, a mask may be fabricated by an additive manufacturing process, according to a computer-aided design (CAD) three-dimensional model that was conventionally developed. FIG. 2 is a schematic block diagram illustrating a process of fabricating a shadow mask 200. A CAD three-dimensional model 205 is provided to a suitable 3D printer 210 or other suitable machine to fabricate the shadow mask 200.

Figure 3:
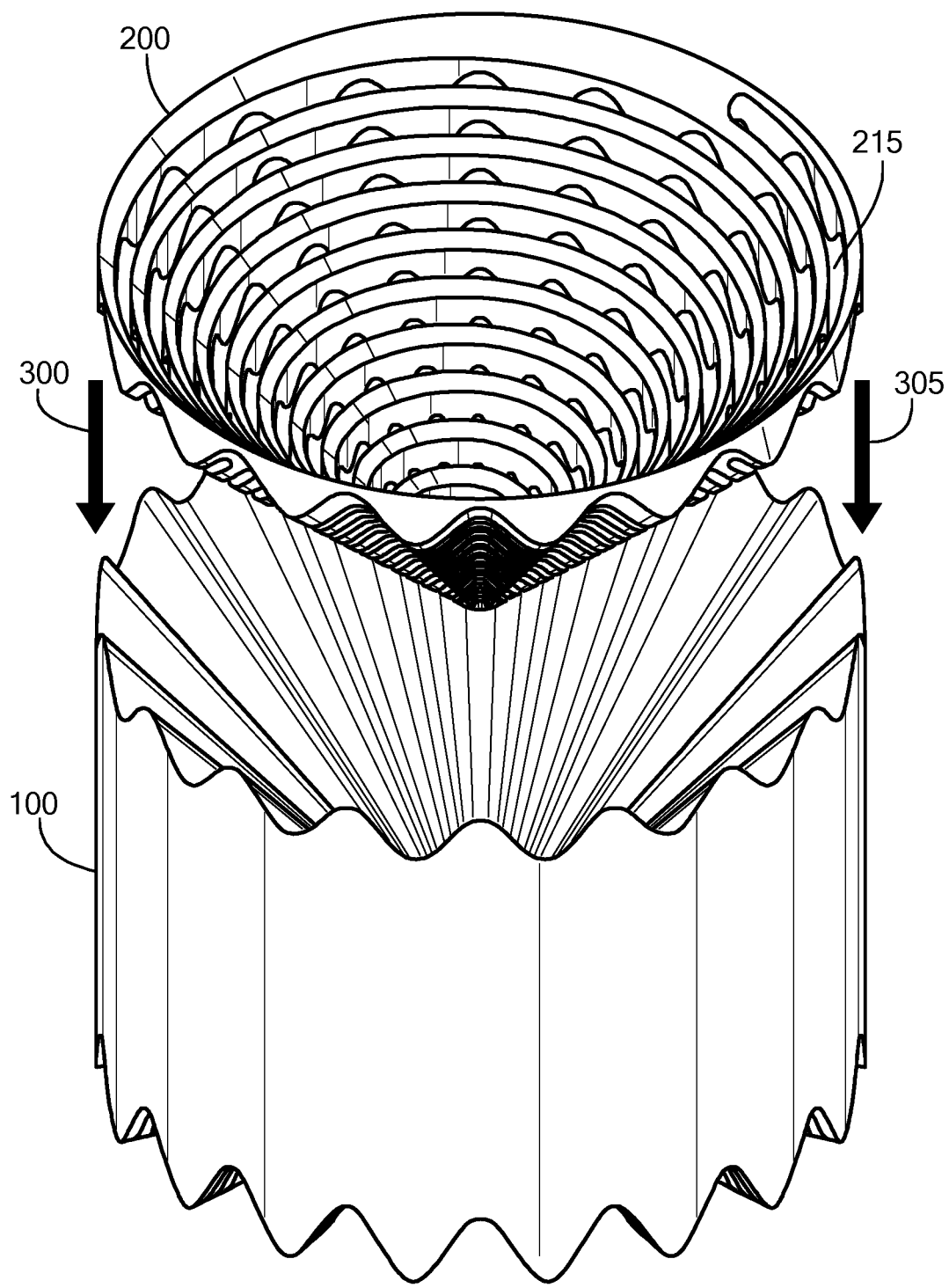
FIG. 3 is a schematic illustration of the shadow mask of FIG. 2 being applied to the substrate of FIG. 1, according to an embodiment of the present invention.
Figure 4:
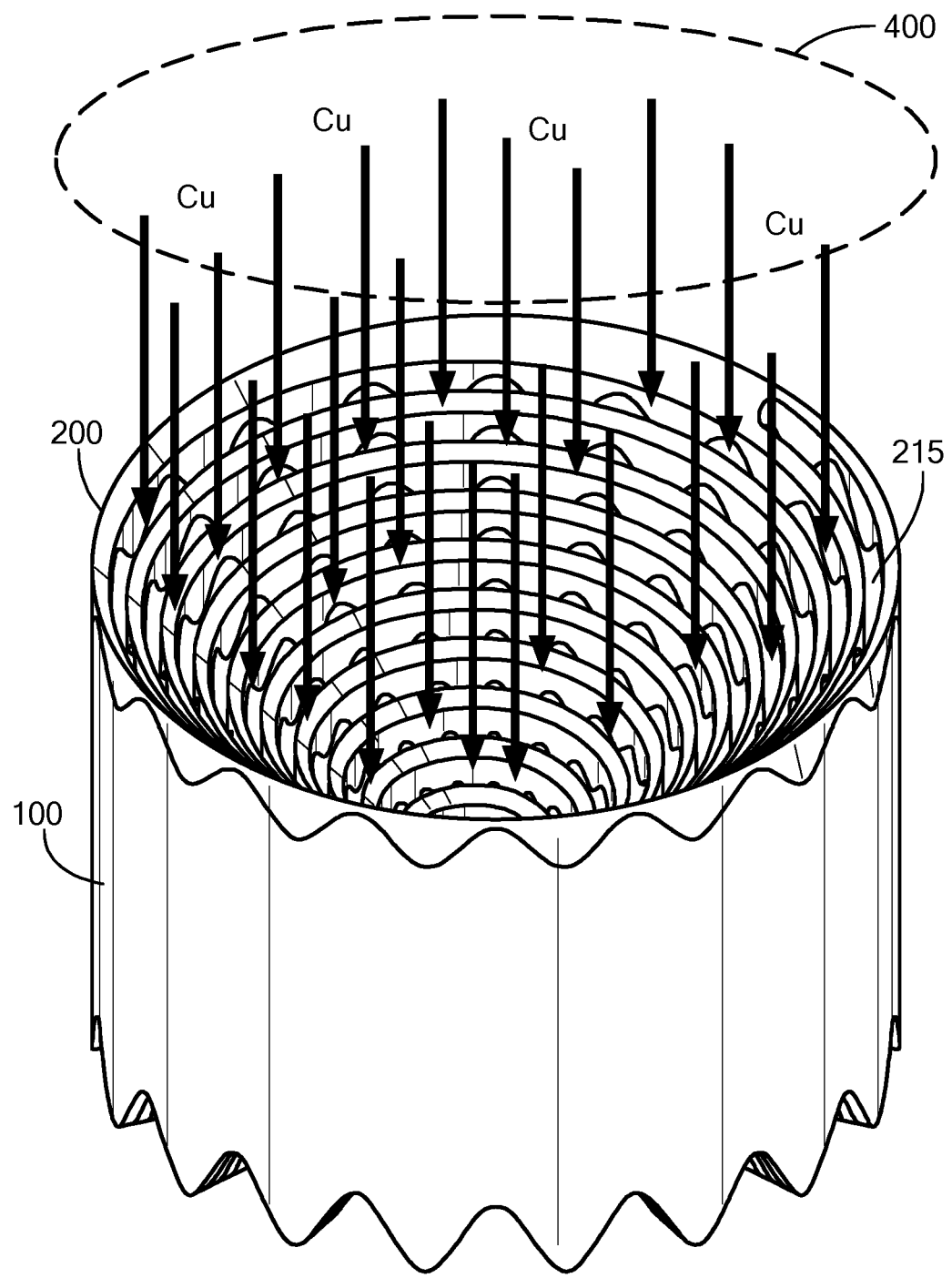
FIG. 4 is a schematic illustration of a process depositing a metal on the substrate of FIG. 1, through apertures defined in the shadow mask of FIG. 2.

The masks define apertures therethrough, as exemplified by aperture 215. As schematically illustrated in FIG. 3, the shadow mask 200 is placed on the substrate 100, as indicated by arrows 300 and 305. Alternatively (not shown), the shadow mask may be fabricated on the substrate. As schematically illustrated in FIG. 4, once the shadow mask 200 is fabricated or placed on the substrate 100, materials, such as metals, here exemplified by copper (Cu), may be deposited 400 on the substrate 100 through the apertures 215 using conventional semiconductor fabrication techniques, such as chemical vapor deposition (CVD) or physical vapor deposition (PVD) techniques, such as sputtering or evaporation.

Figure 5:
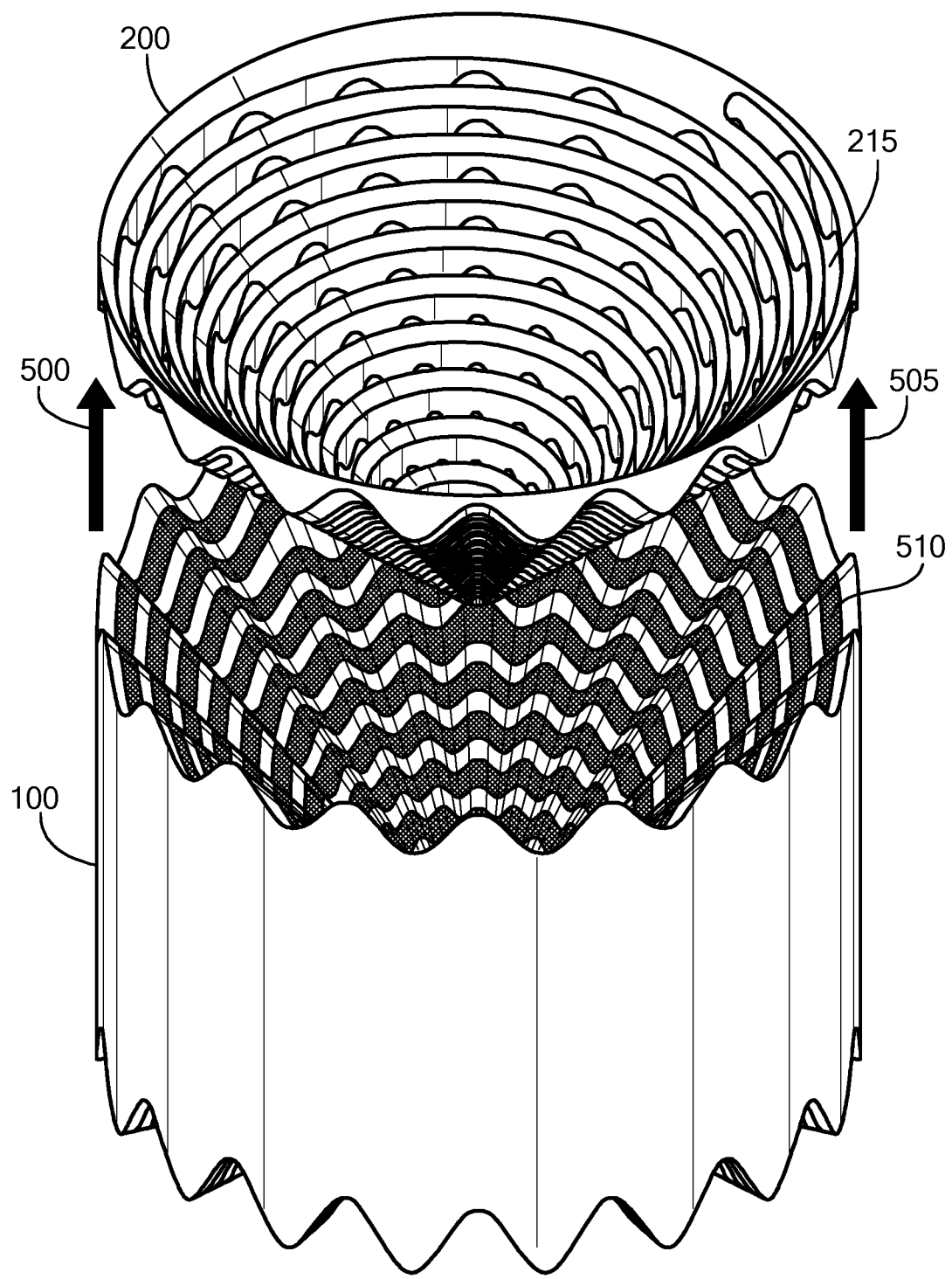
FIG. 5 is a schematic illustration of the shadow mask of FIG. 2 being removed from the substrate of FIG. 1, leaving a seed layer on the substrate, according to an embodiment of the present invention.

As schematically illustrated in FIG. 5, the shadow mask 200 is then removed from the substrate 100, as indicated by arrows 500 and 505, leaving metal, exemplified by metal trace 510, on the three-dimensional surface of the substrate 100. In accordance with aspects of the present invention, the metal trace 510 on the substrate 100 forms a seed layer for further processing. In particular, a plating process may be used to apply additional electrically conductive material to turn the metal trace into a solderable layer. In the case of an antenna, the thickness of the trace is increased to achieve operability in the desired frequency range. In presently preferred embodiments, the resulting electrically conductive film after plating has a thickness of 4-100 μm. Plating may be performed by electroplating or electroless plating. The plating process may deposit more of the same electrically conductive material as the seed layer 510, or a different electrically conductive material may be electroplated on the seed layer.

Figure 6:
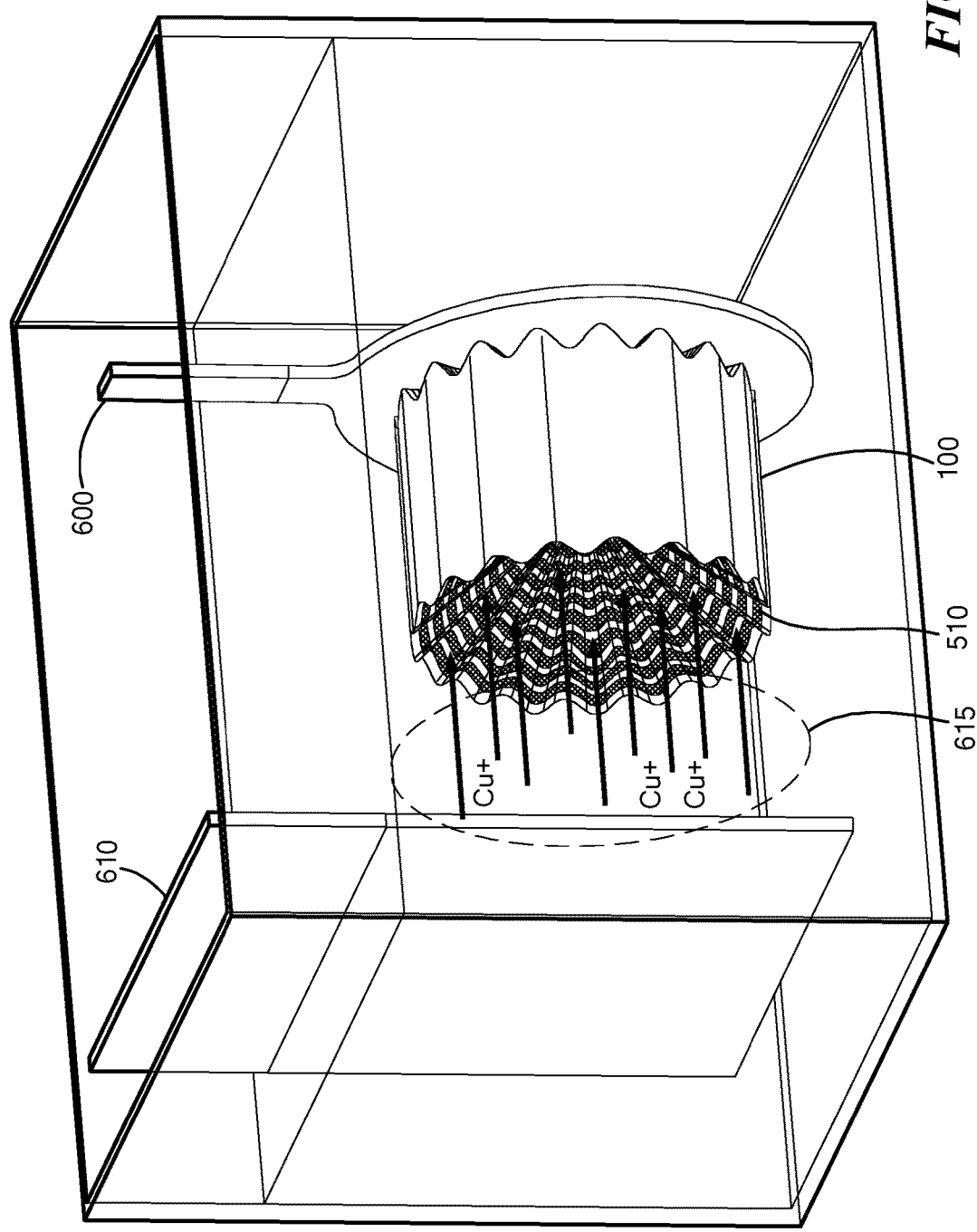
FIG. 6 is a schematic illustration of a process electroplating a metal on the seed layer of FIG. 5, according to an embodiment of the present invention.

An example of the method using electroplating is schematically illustrated in FIG. 6. The substrate 100 may be electrically connected to a cathode 600 and placed in a plating tank 605. The electrical connection is achieved by pressing an electrical contact against the electrical trace so that a voltage can be applied to the trace. The point of contact on the trace will be covered by the electrical contact so no plating will take place at the point of contact. Therefore, the contact is preferably made at the end of the trace. Furthermore, since the voltage falls off the further away one gets from the contact along the trace, it is often preferable to use two contacts, one at each of the ends of the trace. The physical arrangement of the electrical contact will depend upon the configuration of the substrate and the trace on the substrate. In FIG. 6, there may be provided a hole through the center of the substrate through which an electrical contact on the cathode 600 extends for being pressed into contact with an end of the trace. During electroplating, an electric potential is applied between the cathode 600 and an anode 610 made of a suitable material, such as copper, to electroplate more copper 615 onto the seed layer material 510.

In embodiments using electroplating, a low resistivity ohmic contact needs to be established between an electrode and the undulating metal trace on the three-dimensional substrate surface to electroplate evenly. Difficulties were encountered with available electroplating contacts. The metallic components of typical springs or pogo pins become either plated or etched during electroplating. Either of these outcomes is detrimental to the electroplating process because they vary the spring constant of the springs, making the contacts unreliable during a single electroplating process and certainly making them in appropriate for repeated manufacturing use. Also, electroplating contacts are typically used to establish contact with a flat wafer. They are unsuitable for making reliable contact with a trace in the concave and convex surfaces of a complex three-dimensional substrate.

Figure 7:
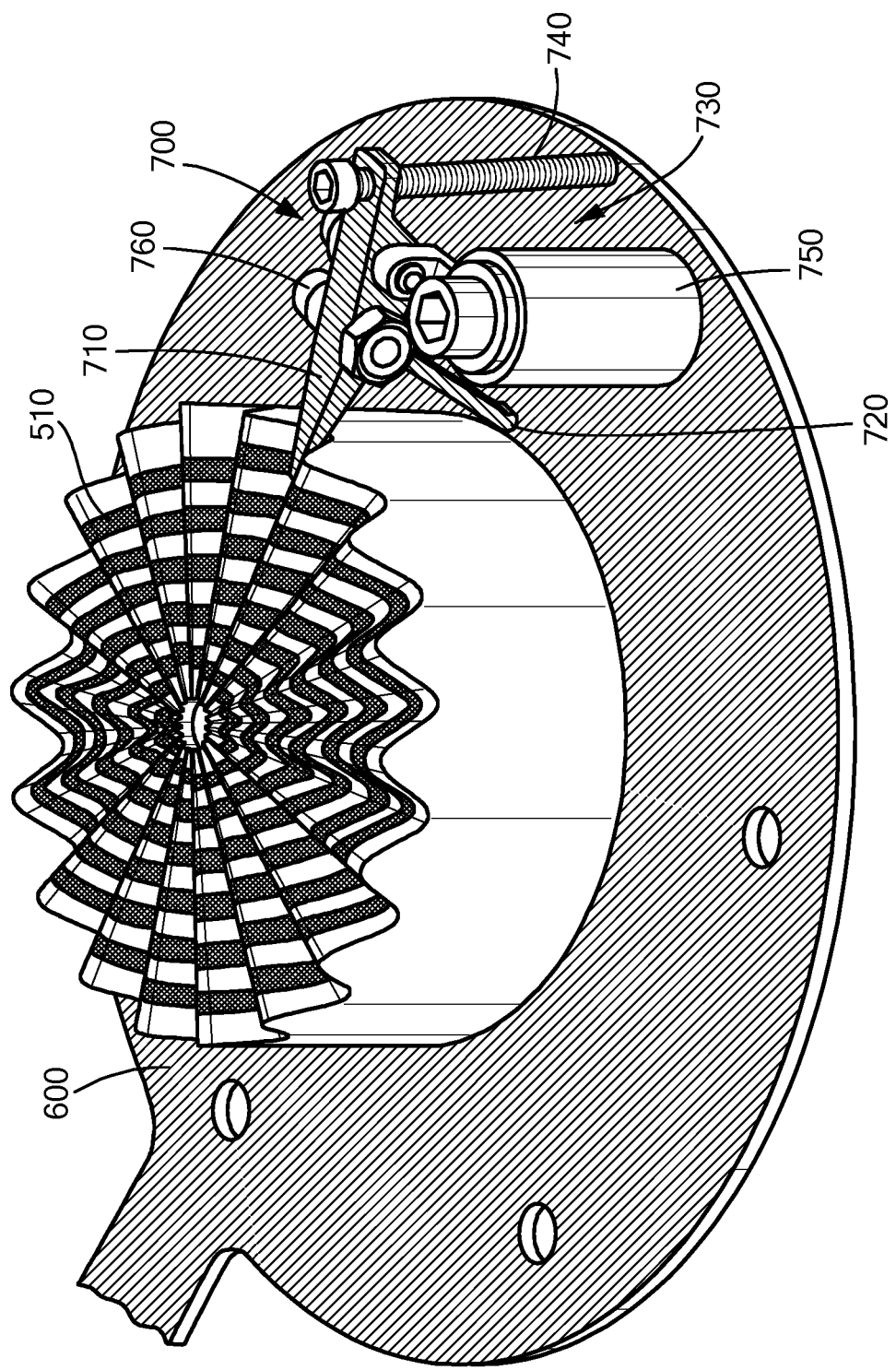
FIG. 7 is a schematic illustration of a contact assembly to allow for an adjustable low resistance contact for the purpose of electroplating as in FIG. 6, according to an embodiment of the present invention.

In accordance with embodiments of the present invention, an electrical contact such as the one shown in FIG. 7 may be used. The contact is a conductive clamp 700, including a trace contact arm 710 for contacting the metal trace and an electrode contact arm 720 for making contact with the electrode, in this case, cathode 600. The electrode contact arm carries the voltage from the electrode to the trace contact arm. The clamp 700 further includes a nonconductive support structure 730 for affixing the components of the clamp relative to the electrode. A nonconductive standoff 750 is of a size commensurate with the size of the substrate to which contact is being made. The nonconductive nuts and bolts of the support structure attach to the arms of the clamp and are used to secure the structure to the electrode baseplate. A nonconductive nut and bolt 760 maintains the electrical contact between both arms and can be used as a joint about which the arms may be rotated to fit them individually against the electrode and the metal trace.

To adjust the height and pressure of the arms against the metal trace and the electrode, a nonconductive threaded shaft 740 is engaged within a threaded receiving hole in the trace contact arm 710. Rotation of the threaded shaft either tightens or loosens the contact arm against the trace depending on the direction of rotation. The bottom of the shaft rests atop the electrode and the end of the contact arm at the receiving hole is either lifted thereby forcing the clamp to tighten against the substrate or the contact pressure is loosened and relieved by rotating the shaft in the opposite direction. In the arrangement of FIG. 7, the trace contact arm 710 acts as a lever arm and the nonconductive support structure 730 acts as a fulcrum. Rotation of the threaded shaft 740 adjusts the pitch of the contact arm 710 and thereby the force of the contact against the conductive trace. By making the clamp parts out of nonconductive materials, they are not subject to the detrimental effects normally associated with metallic clamping structures. Only the contact arms are conductive to serve the purpose of establishing the low resistance ohmic contact between the electrode and the trace.

The nonconductive support structure 730 advantageously maintains the trace contact arm 710 off the surface of the plating electrode baseplate so that the contact arm does not corrode or become stuck to the plating electrode after plating due to metal deposits. The tip of the trace contact arm forms the contact which is large relative to the metal trace, in order to provide low electrical resistance and mechanical strength, and small relative to the three dimensional curvature of the substrate so that it fits within the complex structure to make the required a low resistance contact with the metal trace. A low electrical resistance contact with the trace will improve the prospects for achieving a more uniform plating layer.

Suitable nonconductive materials for use as the support structure and threaded shaft include Teflon®, nylon, Viton®, PVC and polyimide. These materials have good compatibility with sulfuric acid and are stable in the voltages involved in electroplating. For copper plating, copper is the ideal material choice for the conductive trace contact arm and electrode contact arm, however other metals with similar electrode potentials such as silver, gold, and platinum would also be suitable. When plating other metals (e.g. gold), the conductive materials should be that metal or alloy whenever possible. Suitable alternates can be chosen by selecting metals with a similar standard electrode potential to the metal being plated.

The presently described conductive clamp 700 is advantageously adjustable by virtue of the lever arms and nonconductive fulcrum. Alternative nonconductive support structure designs and clamping methods for the arms are possible. For example, one alternative for the threaded shaft could be achieved by using nonconductive filament (such as nylon filament) threaded through a hole in the trace contact arm (forward to the fulcrum) and through holes in the electrode and secured to create the desired contact and clamping force. If adjustability is not required, such as when use of the arrangement is limited to a specific substrate geometry, a fixed position clamp may be used in which the contact arms are rigidly mounted to the electrode baseplate using a nonconductive support.

In some embodiments, it may be preferable to deposit material on the entire trace including the ends, which may not be possible with electroplating. Electroless plating avoids the need for making electrical contacts on the trace. On the other hand, one needs to beware of any degradation effects on parts of the unit being made such as a plastic housing due to the chemicals in the electroless plating process. Nevertheless, electroless plating may be the best method for some applications.

In accordance with additional embodiments of the present invention, after the plating process, an environmentally protective coating may be advantageously applied over the plated electrically conductive material. The protective material should protect the electrically conductive plated trace from such environmental concerns as humidity, oxygen, oils from skin, etc. depending upon the application of electronic circuit. The protective coating may further help mechanically to secure the metal to substrate interface. On the other hand, the protective material should nevertheless permit penetration by a standard process such as soldering to the electrically conductive material of the trace. Examples of suitable protective coatings include $Si_3N_4$, TaN and TiN. An exemplary method of application is by depositing a layer of between 10 nm and 3000 nm of coating material with RF sputtering.

Masks fabricated separate from substrates may, but need not, be used multiple times. After using a mask to selectively deposit metal or another material on a first substrate, the mask may be removed intact from the substrate and placed on another substrate (a second substrate, different than the first substrate). The mask may then be used to selectively deposit metal or another material on a second substrate.

Masks made by additive manufacturing can be made conformal to complex geometries, which is a valuable differentiator from conventional planar masks. Conformal masks made by additive manufacturing cost roughly the same for the same resolution as a planar mask with critical dimensions of around 1 μm, but conformal masks provide benefits by allowing engineers to build parts with out-of-plane geometries.

The mask can be used for depositing a single material or for depositing several materials, one upon the next in layers. For example, adhesion may be improved by depositing a layer of titanium or chromium on a substrate prior to depositing the material of interest, such as copper or gold. Three-dimensional physical shadow masks may also be used to deposit multiple layers that, collectively, form a functional structure, such as an optical waveguide.

After using a mask to deposit a first material or series of materials on a substrate, a portion of the mask may be selectively removed. All or a portion of the mask may be removed chemically or mechanically. In some embodiments, the mask is fabricated using at least two different materials. A first one of the materials may be susceptible to chemical removal by a first solvent, whereas a second one of the materials may not be susceptible to chemical removal by the first solvent. A region of the mask is fabricated with the second material on an outside surface of the mask, thereby protecting that region of the mask from the first solvent. After using the mask to deposit material on the substrate, the mask region not protected by the second material may be chemically removed by the first solvent, leaving the region of the mask protected by the second material, i.e., a modified mask.

The modified mask may then be used to deposit additional material, possibly different than the first material, on the substrate. Optionally or alternatively, before or after depositing the additional material on the substrate, more mask material may be 3D-printed on the remaining mask and/or on the substrate, thereby created a further modified mask. The further modified mask may then be used to deposit further additional material on the substrate. For example, polycarbonate, as printed by a Stratasys Ltd. Titan brand FDM 3D printer, does not dissolve in isopropyl alcohol.

Embodiments of the present invention may be used on complex substrates, such as meshes, as well as on woven fabrics used to make clothing. The surface of meshes and woven fabrics has both positive and negative features, which can be accurately patterned with PVD or CVD materials, such as metals or dielectrics. After such a metal has been deposited, it may be electroplated, as discussed with respect to FIG. 6, to increase the thickness of the metal as needed.

While specific parameter values may be recited for disclosed embodiments, within the scope of the invention, the values of all of parameters may vary over wide ranges to suit different applications. While the invention is described through the above-described exemplary embodiments, modifications to, and variations of, the illustrated embodiments may be made without departing from the inventive concepts disclosed herein. Furthermore, disclosed aspects, or portions thereof, may be combined in ways not listed above and/or not explicitly claimed. Accordingly, the invention should not be viewed as being limited to the disclosed embodiments. Although aspects of embodiments may be described with reference to flowcharts and/or block diagrams, functions, operations, decisions, etc. of all or a portion of each block, or a combination of blocks, may be combined, separated into separate operations or performed in other orders.

What is claimed is:

1. A method for fabricating an electronic circuit, the method comprising:

using a mask to selectively deposit a first electrically conductive material on a three-dimensional substrate via a plurality of apertures in the mask, thereby forming a three-dimensional electrical trace of the first electrically conductive material on the substrate, wherein the mask has an interior shape that conforms to at least a non-planar portion of an exterior shape of the substrate, the non-planar portion defining at least one concave shape;

removing at least a portion of the mask from the substrate; and plating a second electrically conductive material on the electrical trace to form an electrically conductive solderable layer.

2. A method according to claim 1, wherein the first electrically conductive material is same material as the second electrically conductive material.

3. A method according to claim 1, further comprising making a low resistance contact to the three-dimensional electrical trace with a conductive clamp having a nonconductive support structure arranged to permit tightening of the conductive clamp, wherein the plating of the second electrically conductive material comprises electroplating.

4. A method according to claim 3 further comprising a nonconductive threaded shaft arranged so that rotation of the nonconductive threaded shaft produces tightening or loosening of the low resistance contact against the three-dimensional electrical trace.

5. A method according to claim 1, further comprising making at least two low resistance electrical contacts to the three-dimensional electrical trace for applying the voltage to both ends of the electrical trace, wherein the plating of the second electrically conductive material comprises electroplating.

6. A method according to claim 5, wherein at least one of the at least two low resistance contacts is made with a conductive clamp having a nonconductive support structure arranged to permit tightening of the clamp.

7. A method according to claim 6, further comprising a nonconductive threaded shaft arranged so that rotation of the nonconsuctive threaded shaft produces tightening or loosening of the at least one of the at least two low resistance contacts against the electrical trace.

8. A method according to claim 1, wherein the plating of the second electrically conductive material comprises electroless plating.

9. A method according to claim 1, wherein at least the non-planar portion of the exterior shape of the three-dimensional substrate has an undulating shape.

10. A method according to claim 1, further comprising depositing an environmentally protective coating over the second electrically conductive material, wherein the environmentally protective coating is penetrable by soldering so as to allow soldering to the second electrically conductive material.

11. A method according to claim 10, wherein the depositing of the environmentally protective coating comprises RF sputtering silicon nitride to a depth between 10 nm and 3000 nm.

12. A method according to claim 1, wherein the plating of the second electrically conductive material forms an electrically conductive film having a thickness of 4-100 µm.

13. A method according to claim 1, wherein the non-planar portion of the exterior shape of the three-dimensional substrate additionally defines at least one convex shape.

14. A method according to claim 1, further comprising fabricating the mask using an additive manufacturing technique.

15. A method according to claim 14, wherein fabricating the mask comprises fabricating the mask in situ, in intimate contact with the non-planar portion of the exterior shape of the three-dimensional substrate.

16. A method according to claim 14, wherein fabricating the mask comprises fabricating a physical mask separate from the three-dimensional substrate.

17. A method for fabricating an antenna, the method comprising:
fabricating a mask using an additive manufacturing technique, the mask defining a plurality of apertures through the mask, the mask having an interior shape that conforms to at least a non-planar portion of an exterior shape of a substrate having a plurality of concave and convex shapes;
using the mask to selectively deposit a first electrically conductive material on the substrate via the plurality of apertures in the mask, thereby forming an electrical trace of the first electrically conductive material that extends over the plurality of concave and convex shapes on the substrate;
removing at least a portion of the mask from the substrate; and
plating a second electrically conductive material on the electrical trace to form an electrically conductive solderable layer.

18. A method according to claim 17, wherein the first electrically conductive material is same material as the second electrically conductive material.

19. A method according to claim 17, further comprising making a low resistance contact to the electrical trace with a conductive clamp having a nonconductive support structure arranged to permit tightening of the conductive clamp, wherein the plating of the second electrically conductive material comprises electroplating.

20. A method according to claim 19 further comprising a nonconductive threaded shaft arranged so that rotation of the nonconductive threaded shaft produces tightening or loosening of the low resistance contact against the electrical trace.

21. A method according to claim 17, further comprising making at least two low resistance electrical contacts to the electrical trace for applying a voltage to both ends of the electrical trace, wherein the plating of the second electrically conductive material comprises electroplating.

22. A method according to claim 17, further comprising depositing an environmentally protective coating over the second electrically conductive material, wherein the environmentally protective coating is penetrable by soldering so as to allow soldering to the second electrically conductive material.

23. A method according to claim 22, wherein the depositing of the environmentally protective coating comprises RF sputtering silicon nitride to a depth between 10 nm and 3000 nm.

24. A method according to claim 17, wherein the electrically conductive solderable layer has thickness of 4-100 µm.

25. A method for fabricating an electronic circuit, the method comprising:
using a mask to selectively deposit a first electrically conductive material on a three-dimensional substrate via a plurality of apertures in the mask, thereby forming a three-dimensional electrical trace of the first electrically conductive material on the substrate, wherein the mask has an interior shape that conforms to at least a non-planar portion of an exterior shape of the substrate;
removing at least a portion of the mask from the substrate;
plating a second electrically conductive material on the electrical trace to form an electrically conductive solderable layer; and
depositing an environmentally protective coating over the second electrically conductive material, wherein the environmentally protective coating is penetrable by soldering so as to allow soldering to the second electrically conductive material.

26. A method according to claim 25, further comprising making a low resistance contact to the three-dimensional electrical trace with a conductive clamp having a nonconductive support structure arranged to permit tightening of the conductive clamp, wherein the plating of the second electrically conductive material comprises electroplating.

27. A method according to claim 26 further comprising a nonconductive threaded shaft arranged so that rotation of the nonconductive threaded shaft produces tightening or loosening of the low resistance contact against the three-dimensional electrical trace.

28. A method according to claim 25, wherein at least the non-planar portion of the exterior shape of the three-dimensional substrate has an undulating shape.

29. A method according to claim 25, wherein the depositing of the environmentally protective coating comprises RF sputtering silicon nitride to a depth between 10 nm and 3000 nm.

30. A method according to claim 25, wherein the non-planar portion of the exterior shape of the three-dimensional substrate defines at least one concave shape.

31. A method according to claim 25, wherein the non-planar portion of the exterior shape of the three-dimensional substrate defines at least one concave shape and at least one convex shape.

32. A method according to claim 25, further comprising fabricating the mask using an additive manufacturing technique.

33. A method according to claim 32, wherein fabricating the mask comprises fabricating a physical mask separate from the three-dimensional substrate.

34. A method for fabricating an electronic circuit, the method comprising:
using a mask to selectively deposit a first electrically conductive material on a three-dimensional substrate via a plurality of apertures in the mask, thereby forming a three-dimensional electrical trace of the first electrically conductive material on the substrate, wherein the mask has an interior shape that conforms to at least a non-planar portion of an exterior shape of the substrate;
removing at least a portion of the mask from the substrate;
making a low resistance contact to the three-dimensional electrical trace with a conductive clamp having a nonconductive support structure arranged to permit tightening of the conductive clamp; and
electroplating a second electrically conductive material on the electrical trace to form an electrically conductive solderable layer.

35. A method according to claim 34 further comprising a nonconductive threaded shaft arranged so that rotation of the nonconductive threaded shaft produces tightening or loosening of the low resistance contact against the three-dimensional electrical trace.

36. A method according to claim 34, further comprising making at least two low resistance electrical contacts to the three-dimensional electrical trace for applying a voltage to both ends of the trace.

37. A method according to claim 36, wherein at least one of the at least two low resistance contacts is made with the conductive clamp.

38. A method according to claim 37, further comprising a nonconductive threaded shaft arranged so that rotation of the nonconductive threaded shaft produces tightening or loosening of the at least one of the at least two low resistance contacts against the electrical trace.

39. A method according to claim 34, wherein the non-planar portion of the exterior shape of the three-dimensional substrate defines at least one concave shape and at least one convex shape.

40. A method according to claim 34, wherein fabricating the mask comprises fabricating a physical mask separate from the three-dimensional substrate.

* * * * *

UNITED STATES PATENT AND TRADEMARK OFFICE
CERTIFICATE OF CORRECTION

PATENT NO. : 10,396,469 B1
APPLICATION NO. : 15/179047
DATED : August 27, 2019
INVENTOR(S) : Gregory M. Fritz, Kenneth P. Vandevoordt and Rebecca A. DeFronzo Page 1 of 1

It is certified that error appears in the above-identified patent and that said Letters Patent is hereby corrected as shown below:

In the Claims

In Column 9, Line 27:
Replace "nonconsuctive"
With "nonconductive"

Signed and Sealed this
Twenty-ninth Day of October, 2019

Andrei Iancu
*Director of the United States Patent and Trademark Office*